US00RE45151E

(19) United States
(12) Reissued Patent
Sapiejewski

(10) Patent Number: US RE45,151 E
(45) Date of Reissued Patent: Sep. 23, 2014

(54) HEADSET NOISE REDUCING

(75) Inventor: Roman Sapiejewski, Boston, MA (US)

(73) Assignee: Bose Corporation, Framingham, MA (US)

(21) Appl. No.: 13/299,298

(22) Filed: Nov. 17, 2011

Related U.S. Patent Documents

Reissue of:
(64) Patent No.: 6,597,792
Issued: Jul. 22, 2003
Appl. No.: 09/353,425
Filed: Jul. 15, 1999

U.S. Applications:
(63) Continuation of application No. 10/754,094, filed on Jan. 8, 2004, now Pat. No. Re. 43,939, which is an application for the reissue of Pat. No. 6,597,792.

(51) Int. Cl.
*H03B 29/00* (2006.01)
*G10K 11/16* (2006.01)
*H04R 25/00* (2006.01)

(52) U.S. Cl.
USPC ..... 381/71.6; 381/372

(58) Field of Classification Search
USPC ..... 381/71.6, 74, 71.1, 312, 371, 372; 181/129
See application file for complete search history.

(56) References Cited

U.S. PATENT DOCUMENTS

| | | | | |
|---|---|---|---|---|
| 4,644,581 A * | 2/1987 | Sapiejewski | ..... | 381/74 |
| 5,182,774 A * | 1/1993 | Bourk | ..... | 381/71.6 |
| 5,208,868 A | 5/1993 | Sapiejewski | ..... | 381/183 |
| 5,913,178 A * | 6/1999 | Olsson | ..... | 455/575.3 |
| 7,103,188 B1 * | 9/2006 | Jones | ..... | 381/71.9 |

FOREIGN PATENT DOCUMENTS

| | | |
|---|---|---|
| DE | 3212519 | 1/1991 |
| EP | 0582404 A | 2/1994 |
| EP | 0 688 143 | 6/1995 |
| EP | 0688143 A | 12/1995 |
| EP | 0873040 A | 10/1998 |
| JP | S59-091090 | 6/1984 |
| JP | 62002798 | 1/1987 |
| JP | 62061593 | 4/1987 |
| JP | 1196999 | 8/1989 |
| JP | 5036991 | 5/1993 |
| JP | H08-047074 | 2/1996 |

OTHER PUBLICATIONS

Japanese Office Action in counterpart Application No. 2011-028867, dated Mar. 13, 2012, 3 pages.
Decision of Rejection (with translation); JP 2011-028867; Aug. 7, 2012.

* cited by examiner

*Primary Examiner* — Ping Lee
(74) *Attorney, Agent, or Firm* — Fish & Richardson P.C.

(57) ABSTRACT

A headset has an earcup with front opening adjacent to an annular cushion formed with a plurality of openings facing the inside of the earcup that acoustically couples the earcup volume to the cushion volume. A driver is seated inside the earcup with a microphone adjacent to the driver. Active noise reducing circuitry intercouples the driver and microphone. An acoustic load that may comprise a wire mesh resistive cover and/or air mass adjacent the microphone is constructed and arranged to reduce the effect of resonances in the earcup volume.

2 Claims, 4 Drawing Sheets

HEADSET NOISE REDUCING

Matter enclosed in heavy brackets [ ] appears in the original patent but forms no part of this reissue specification; matter printed in italics indicates the additions made by reissue.

*This application is a continuation of U.S. Reissue application Ser. No. 10/754,094, filed on Jan. 8, 2004, which is a reissue application of U.S. Ser. No. 09/353,425, filed on Jul. 15, 1999 (now U.S. Pat. No. 6,597,792) issued on Jul. 22, 2003.*

The present invention relates in general to headset noise reducing and more particularly concerns novel apparatus and techniques for actively and/or passively reducing the noise perceived by the user of a headset.

BACKGROUND OF THE INVENTION

For background reference is made to U.S. Pat. Nos. 5,305,387, 5,208,868, 5,181,252, 4,989,271, 4,922,542, 4,644,581 and 4,455,675. Reference is also made to the Bose active noise-reducing headsets that are or were commercially available from Bose Corporation that are incorporated by reference herein.

It is an important object of the invention to provide improved noise-reducing for headsets.

BRIEF SUMMARY OF THE INVENTION

According to the invention, there is an earcup closed at the back away from the ear of a user and open at the front adjacent to the ear of the user. There is a driver inside the earcup. The earcup has a cushion that is seated in the front opening and formed with an ear opening for accommodating the ear of the user and an annular ridge surrounding the ear opening formed with a plurality of openings with adjacent openings typically spaced from each other by of the order of the width of an opening measured along the circumference of the ear opening with each opening having a radial width generally perpendicular to the circumference of the ear opening slightly less than the radial width of the annular ridge. For active noise reduction, there is a microphone adjacent to the driver coupled to the driver by electronic circuitry that furnishes active noise reduction and an acoustical load around the microphone and driver. The acoustic load may comprise a resistive mesh screen and/or air in a tube. Other features, objects and advantages will become apparent from the following detailed description when read in connection with the accompanying drawings in which:

DETAILED DESCRIPTION

Figure 1A:
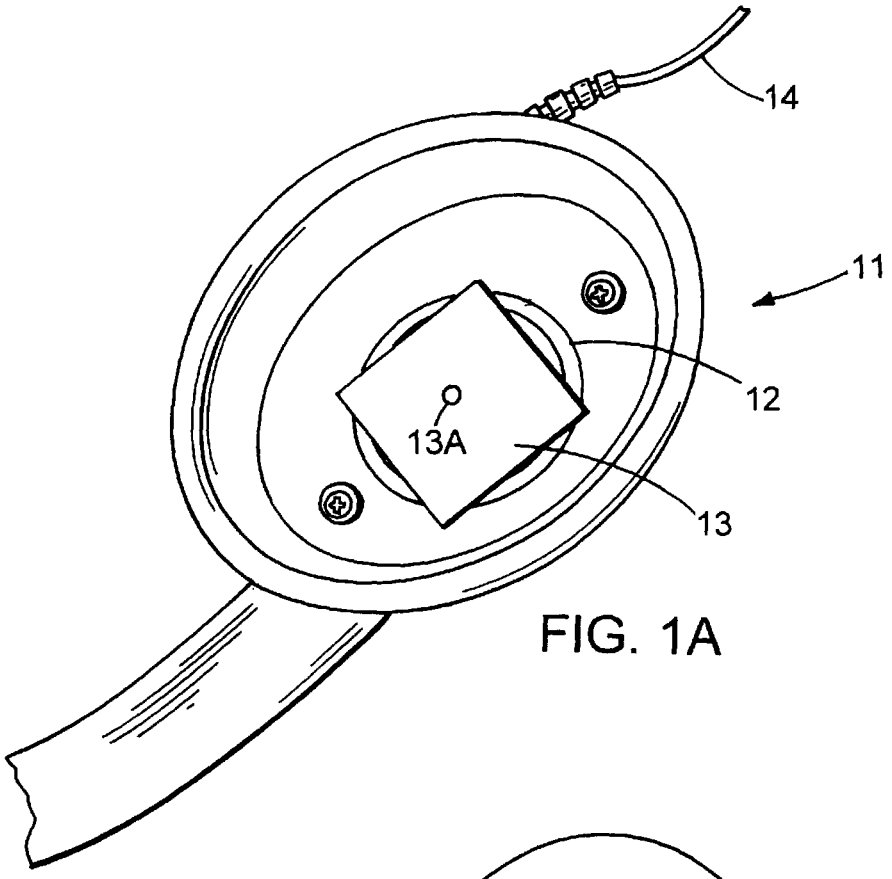
FIG. 1A is a perspective view of a headset earcup assembly embodying the invention with the cushion shown in FIG. 1B according to the invention removed.
Figure 1B:
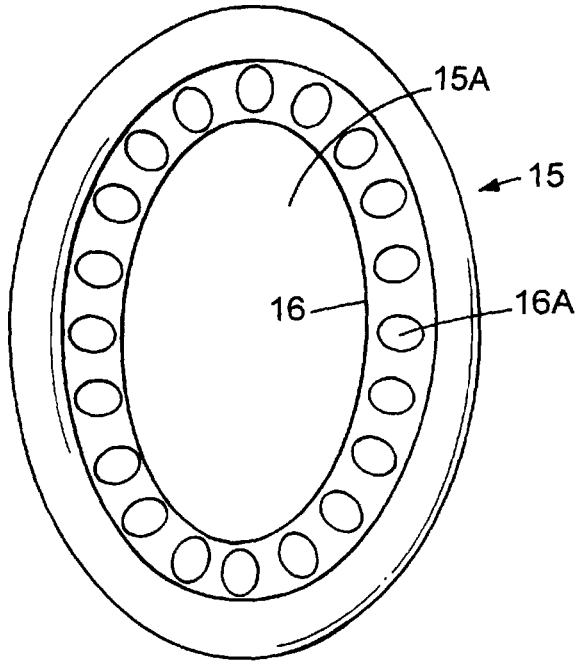

With reference now to the drawings and, more particularly, FIGS. 1A and 1B thereof, there is shown a perspective view of an earcup assembly according to the invention with the perforated cushion of FIG. 1B removed. Earcup 11 is closed at the rear away from the ear of a user and supports driver 12 and a closely adjacent microphone (not seen in FIG. 1A) that is covered by resistive mesh screen 13 typically formed with an opening 13A exposing the microphone and comprising an acoustical load. Electronic circuitry intercouples the microphone and driver 12 to provide active noise reduction and exchange audio signals through cable 14 for transduction by driver 12 into desired sound signal for the wearing user and by the microphone into a noise-reducing audio signal.

Referring also to FIG. 1B, cushion 15 covers the exposed front opening adjacent to the ear of the wearing user and is formed with an ear opening 15A for accommodating the ear of the wearing user and an annular ridge 16 surrounding ear opening 15A that is formed with a plurality of openings, such as 16A, through which an annular ring of foam is visible that rests against driver 12 when assembled.

Figure 2:
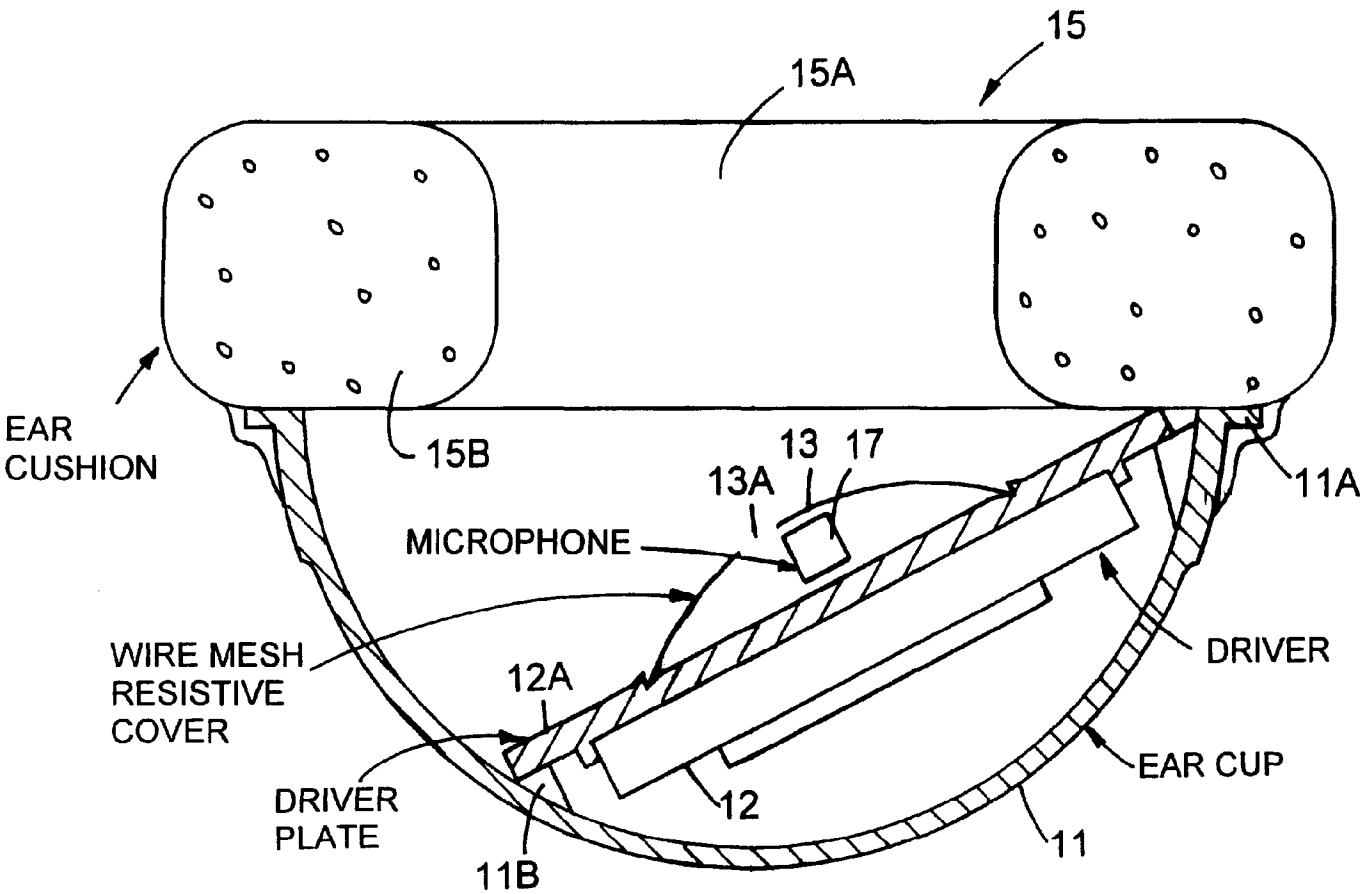
FIG. 2 is a sectional view of an earcup assembly according to the invention.

Referring to FIG. 2, there is shown a diagrammatic sectional view through an assembled earcup. Driver 12 is seated in earcup 11 with driver plate 12A extending rearward from a lip 11A of earcup 11 to a ridge 11B with microphone 17 closely adjacent to driver 12 and covered by wire mesh resistive cover 13. Cushion 15 covers the front opening of earcup 11 and includes foam 15B.

Figure 3:
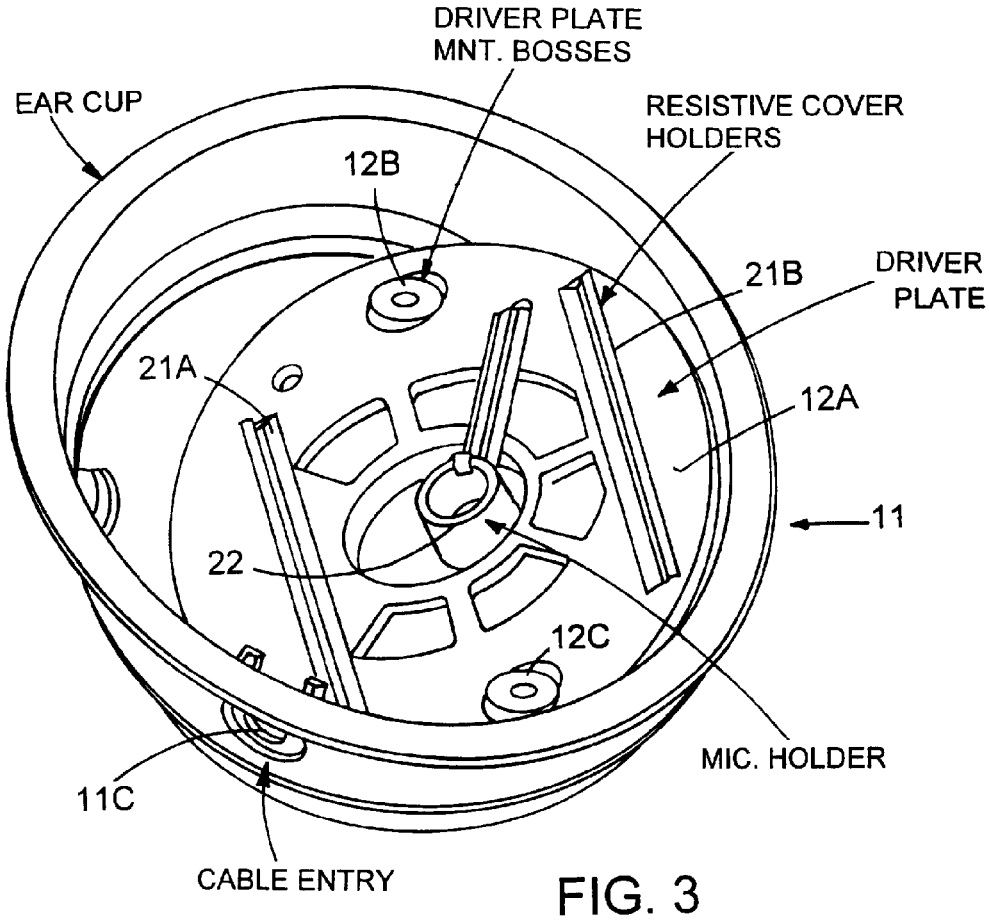
FIG. 3 is a pictorial perspective view into the earcup assembly with the microphone and resistive cover plate removed.

Referring to FIG. 3, there is shown a pictorial perspective view into earcup 11 with cushion 15, microphone 17 and wire mesh resistive cover 13 removed to illustrate certain structural details. Earcup 11 is formed with a cable entry 11C for accommodating cable 14 for receiving audio signals for transduction by driver 12 and intercoupling external electronic circuitry with the drive and microphone. Driver plate 12A carries resistive cover holders 21A and 21B for supporting the wire mesh resistive cover 13. Microphone holder 22 extends from the rear wall of earcup 11 for supporting microphone 17 and encloses air that comprises acoustical loading. Driver plate mounting bosses 12B and 12C furnish a means for attaching driver plate 12A to earcup 11. Driver 12 divides earcup 11 into a front volume typically about 50 CC adjacent to the front opening and a rear volume typically about 15 CC enclosed by the closed end of earcup 11.

Figure 4:
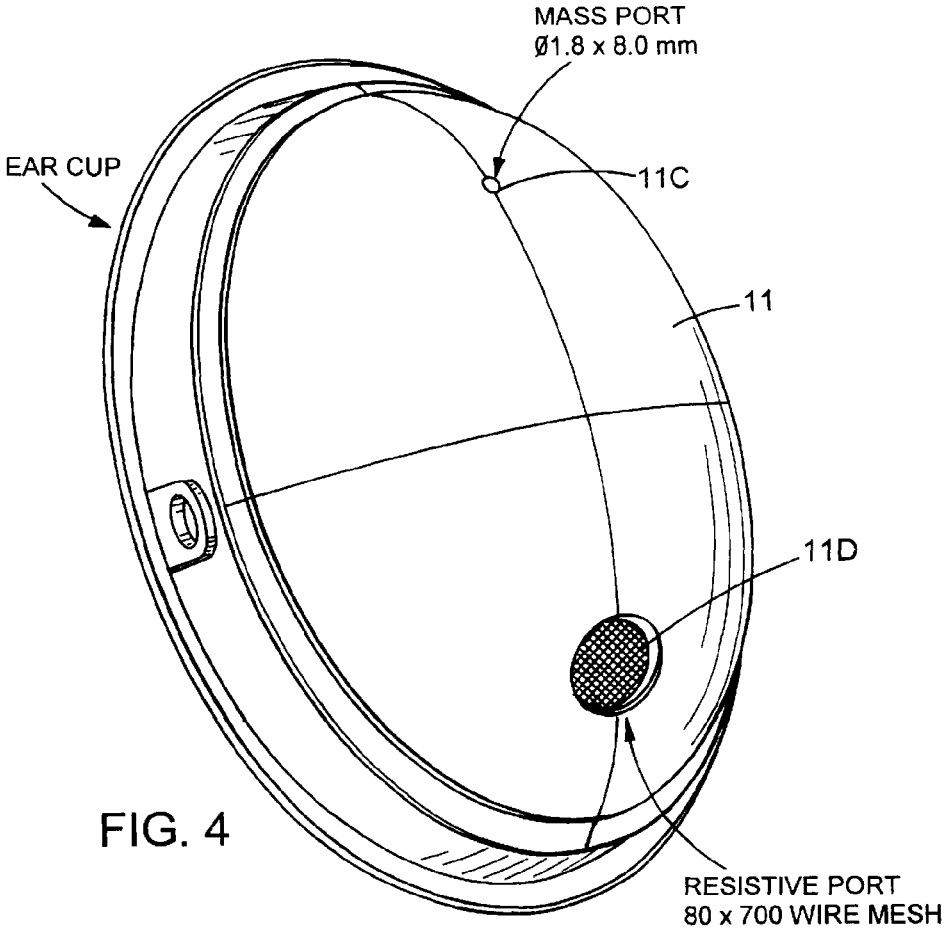
FIG. 4 is a perspective view showing the outside of an earcup.

Referring to FIG. 4, there is shown a rear view of earcup 11 showing mass port 11C and resistive port 11D covered by a wire mesh.

Figure 5:
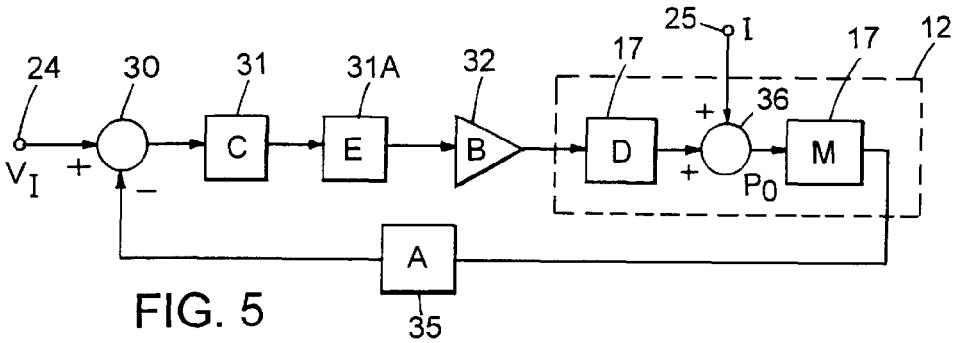
FIG. 5 is a block diagram of a system embodying the invention.

With reference now to the drawing and more particularly FIG. 5 thereof, there is shown a block diagram illustrating the logical arrangement of a system incorporating the invention corresponding substantially to FIG. 1 of the aforesaid '581 patent. A signal combiner 30 algebraically combines the signal desired to be reproduced by the earphone on input terminal 24 with a feedback signal provided by microphone preamplifier 35. Signal combiner 30 provides the combined signal to compressor 31 which limits the level of the high level signals. The output of compressor 31 is applied to compensator 31A. Compensator 31A includes compensation circuits to insure that the open loop gain meets the Nyquist stability criteria, so that the system will not oscillate when the loop is closed. The system shown is duplicated once each for the left and right ears.

Power amplifier 31 amplifies the signal from compensator 31A and energizes earphone driver 2 to provide an acoustical signal in the front cavity that is combined with an outside noise signal that enters the front cavity from a region represented as acoustical input terminal 25 to produce a combined acoustic pressure signal in the front cavity represented as a circle 36 to provide a combined acoustic pressure signal applied to and transduced by microphone 7. Microphone amplifier 35 amplifies the transduced signal and delivers it to signal combiner 30.

Having described the structural arrangement of an embodiment of the invention, principles of operation will be described. A problem in active noise-reducing circumaural headphones arises from earcup resonances causing a rough acoustic response that is a function of the head of the user, making electronic compensation difficult.

One approach for smoothing the acoustic response is to place damping material, typically highly absorptive foam, around the walls of the earcup. This approach typically requires a significant thickness of foam to provide sufficient damping and requires earcups of relatively large volume to accommodate the thick foam. Furthermore, the damping of the highly absorptive foam is a sensitive function of the physical dimensions of the foam and atmospheric conditions, causing inconsistent acoustical response.

Resonance in the earcup may produce instability by causing oscillation at certain frequencies that typically limits the amount of feedback for active noise reduction. By acoustically loading the microphone and driver with the wire mesh resistive cover 13 and/or the enclosed air, resonances are significantly reduced, allowing increased gain in the feedback loop and significantly improved active noise reduction in an earcup of relatively small volume.

By forming openings in annular ridge 16 of cushion 15 to expose foam material 15B, the effective volume of the earcup is significantly increased to embrace the volume occupied by cushion 15 and thereby increase passive attenuation and provides additional damping to help smooth the audio response at the ear and control stability with the headset off the head.

The invention has a number of advantages. Cup size is relatively small, yet there is considerable effective volume with the additional effective volume afforded by cushion 15 accessed through openings such as 16A. The effect of resonances inside earcup 11 is significantly reduced with wire mesh resistive cover 13 and/or the enclosed air, thereby allowing a significant increase in loop gain of the active noise reducing system.

It is evident that those skilled in the art may now make numerous uses and modifications of and departures from the specific apparatus and techniques herein disclosed without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

[1. A headset comprising, an earcup having a front opening adapted to be adjacent to the ear of the user, a driver inside said earcup, a cushion around the periphery of said front opening formed with an ear opening constructed and arranged to accommodate the ear of a user and formed with a plurality of openings around said opening constructed and arranged to acoustically add the volume of said cushion to the volume of said earcup and enhance passive attenuation.]

[2. A headset in accordance with claim 1 and further comprising, a microphone inside said earcup adjacent to said driver, and active noise reducing circuitry intercoupling said microphone and said driver constructed and arranged to provide active noise reduction, whereby said cushion with said plurality of openings is further constructed and arranged to furnish additional damping to help smooth the audio response at the ear of a user and control stability with the headset off the head.]

[3. A headset in accordance with claim 2 and further comprising, an acoustic load in close proximity to said microphone constructed and arranged to reduce the effects of resonances in said earcup.]

[4. A headset in accordance with claim 3 wherein said acoustic load comprises a wire mesh resistive cover.]

[5. A headset in accordance with claim 4 wherein said wire mesh resistive cover is formed with an opening near said microphone.]

[6. A headset in accordance with claim 4 wherein said wire mesh resistive cover coacts with said driver to substantially enclose said microphone.]

*7. A headset comprising,*

*an earcup having a front opening adapted to be adjacent to the ear of the user,*

*a driver inside said earcup, a microphone inside said earcup adjacent to said driver,*

*active noise reducing circuitry intercoupling said microphone and said driver constructed and arranged to provide active noise reduction, and*

*a resistive wire cover positioned over said driver and said microphone coacting with said driver to substantially enclose said microphone,*

*said resistive cover and said driver defining a volume with enclosed air and said microphone there between,*

*said enclosed air and said resistive cover forming an acoustic load, said acoustic load reducing the effects of resonances in the earcup, and*

*further comprising a mass port and a resistive port extending through a closed end of the earcup.*

*8. The headset in accordance with claim 7 further comprising a resistive port wire mesh covering an external opening of the resistive port.*

* * * * *